(12) United States Patent
Chen et al.

(10) Patent No.: US 11,387,356 B2
(45) Date of Patent: Jul. 12, 2022

(54) SEMICONDUCTOR STRUCTURE AND HIGH-ELECTRON MOBILITY TRANSISTOR DEVICE HAVING THE SAME

(71) Applicant: Vanguard International Semiconductor Corporation, Hsinchu (TW)

(72) Inventors: Chih-Yen Chen, Tainan (TW); Franky Juanda Lumbantoruan, Sumatera Utara (ID)

(73) Assignee: Vanguard International Semiconductor Corporation, Hsinchu (TW)

( * ) Notice: Subject to any disclaimer, the term of this patent is extended or adjusted under 35 U.S.C. 154(b) by 131 days.

(21) Appl. No.: 16/944,784

(22) Filed: Jul. 31, 2020

(65) Prior Publication Data
US 2022/0037516 A1 Feb. 3, 2022

(51) Int. Cl.
*H01L 29/15* (2006.01)
*H01L 29/778* (2006.01)
(Continued)

(52) U.S. Cl.
CPC .... *H01L 29/7783* (2013.01); *H01L 21/02507* (2013.01); *H01L 29/15* (2013.01);
(Continued)

(58) Field of Classification Search
CPC ........... H01L 29/7783; H01L 21/02507; H01L 29/66431; H01L 29/66462; H01L 29/778–7789
See application file for complete search history.

(56) References Cited

U.S. PATENT DOCUMENTS

| 10,290,730 B1* | 5/2019 | Yang ................. H01L 21/02458 |
| 2013/0334495 A1* | 12/2013 | Lim ....................... H01L 29/155 |
| | | 257/15 |

(Continued)

FOREIGN PATENT DOCUMENTS

| CN | 104078500 A | 10/2014 |
| TW | 201633532 A | 9/2016 |
| TW | 202016977 A | 5/2020 |

OTHER PUBLICATIONS

Taiwanese Office Action and Search Report for Taiwanese Application No. 109120017, dated Jan. 19, 2021.

*Primary Examiner* — Eric A. Ward
(74) *Attorney, Agent, or Firm* — Birch, Stewart, Kolasch & Birch, LLP

(57) ABSTRACT

A semiconductor structure includes a seed layer on a substrate and an epitaxial stack on the seed layer. The epitaxial stack includes a first superlattice part and a second superlattice part on the first superlattice part. The first superlattice part includes first units repetitively stacked M1 times on the seed layer. Each first unit includes a first sub-layer that is an $Al_{y1}Ga_{1-y1}N$ layer, and a second sub-layer that is an $Al_{x1}Ga_{1-x1}N$ layer, wherein y1<x1. The second superlattice part includes second units repetitively stacked M2 times on the first superlattice part. Each second unit includes a third sub-layer that is an $Al_{y2}Ga_{1-y2}N$ layer, and a fourth sub-layer that is an $Al_{x2}Ga_{1-x2}N$ layer, wherein y2<x2. M1 and M2 are positive integers, 0≤x1, y1 and y2<1, 0<x2≤1, and x1<x2, or x1=x2 and y1<y2.

29 Claims, 8 Drawing Sheets

(51) Int. Cl.
  *H01L 29/20* (2006.01)
  *H01L 29/205* (2006.01)
  *H01L 21/02* (2006.01)
(52) U.S. Cl.
  CPC ........ *H01L 29/2003* (2013.01); *H01L 29/205* (2013.01); *H01L 29/778* (2013.01)

(56) References Cited

U.S. PATENT DOCUMENTS

| | | | | |
|---|---|---|---|---|
| 2015/0340230 | A1* | 11/2015 | Ikuta | C23C 16/45531 438/478 |
| 2016/0149000 | A1* | 5/2016 | Sazawa | C23C 16/303 257/18 |
| 2016/0240679 | A1* | 8/2016 | Chen | H01L 29/205 |
| 2017/0025523 | A1* | 1/2017 | Prechtl | H01L 23/49551 |
| 2017/0323960 | A1* | 11/2017 | Sato | C30B 29/406 |
| 2018/0005827 | A1* | 1/2018 | Odnoblyudov | H01L 21/7806 |

* cited by examiner

SEMICONDUCTOR STRUCTURE AND HIGH-ELECTRON MOBILITY TRANSISTOR DEVICE HAVING THE SAME

BACKGROUND

Technical Field

The disclosure relates to a semiconductor structure, and it relates to a semiconductor structure that can reduce wafer curvature and a high-electron mobility transistor (HEMT) device having the semiconductor structure that can significantly improve the electrical properties of the HEMT device.

Description of the Related Art

In recent years, the development of semiconductor devices for use in computers, consumer electronics, and other fields has progressed rapidly. Currently, semiconductor device technology has been widely accepted in Metal-Oxide-Semiconductor Field-Effect Transistor (MOSFET) products that have a high market share. Semiconductor devices are used in a variety of electronic applications, such as high-power devices, personal computers, cell phones, digital cameras, and other electronic devices. These semiconductor devices are typically fabricated by depositing insulating layers or dielectric layers, conductive layer materials, and semiconductor layer materials on a semiconductor substrate, followed by patterning the various material layers by using photolithography processes. Therefore, the circuit devices and components are formed on the semiconductor substrate.

Among these semiconductor devices, high-electron mobility transistors (HEMTs) have been widely used in the field of high-power applications since they have such advantages as high output power and high breakdown voltage. Although present semiconductor devices and methods for manufacturing the same have been adequate for their intended purposes, they have not been entirely satisfactory in all respects. Therefore, it needs to solve some problems in regards to semiconductor devices and manufacturing methods of semiconductor integrated circuits and technology. For example, several epitaxial material layers are formed on a substrate of a high-electron mobility transistor (HEMT) device by an epitaxial growth method. The lattice mismatch between the heterojunction of the epitaxial material layers (e.g. the lattice constants of the upper and lower material layers are different) and the thermal mismatch between the epitaxial material layer and the substrate will induce extra stress in the epitaxial material layers. Also, this stress accumulates as the thicknesses of the epitaxial material layers increase. When the thicknesses of the epitaxial material layers exceed the critical thickness, the stress begins to release continuously, and even results in the substrate cracking.

Therefore, although existing semiconductor devices and methods for manufacturing the same have generally been adequate for their intended purposes, it needs to solve some problems in regards to the structure of the semiconductor devices. It is one of the important goals for the developers and the manufacturers to provide a semiconductor device that can effectively prevent the aforementioned problem of the substrate cracking, thereby improving the electrical properties of the semiconductor device.

SUMMARY

Some embodiments of the present disclosure provide semiconductor structures. A semiconductor structure includes a substrate, a seed layer on the substrate, and an epitaxial stack on the seed layer. In some embodiments, the epitaxial stack includes a first superlattice part on the seed layer and a second superlattice part on the first superlattice part. The first superlattice part includes several first units repetitively stacked M1 times on the seed layer, and each of the first units includes a first sub-layer and a second sub-layer on the first sub-layer. The first sub-layer includes an $Al_{y1}Ga_{1-y1}N$ layer with a thickness of b1 nanometers (nm), and the second sub-layer includes an $Al_{x1}Ga_{1-x1}N$ layer with a thickness of a1 nanometers (nm), wherein y1 is less than x1. The second superlattice part includes several second units repetitively stacked M2 times on the first superlattice part, and each of the second units includes a third sub-layer and a fourth sub-layer on the third sub-layer. The third sub-layer includes an $Al_{y2}Ga_{1-y2}N$ layer with a thickness of b2 nanometers (nm), and the fourth sub-layer includes an $Al_{x2}Ga_{1-x2}N$ layer with a thickness of a2 nanometers (nm), wherein y2 is less than x2. In some embodiments, M1 and M2 are positive integers, x1, y1 and y2 are greater than 0 and less than 1, x2 is greater than 0 and equal to or less than 1. Also, x1 is less than x2. Alternatively, x1 is equal to x2, and y1 is less than y2.

In some embodiments, the substrate includes a ceramic material. Also, the substrate includes a base and an insulating layer encapsulating the base. The insulating layer includes single or several insulating material layers, and covers all of the surfaces (e.g. the top surface, the bottom surfaces and all of the side surfaces) of the base.

In some embodiments, y1 is less than y2.

In some embodiments, a1 is less than a2, and b1 is greater than b2.

In some embodiments, y2 is greater than y1, and b2 is greater than b1.

In some embodiments, a1 is equal to or greater than a2.

In some embodiments, M1 is less than M2.

In some embodiments, the overall thickness of the first superlattice part is less than the overall thickness of the second superlattice part.

In some embodiments, the first superlattice part includes a first dopant having a first doping concentration, and the second superlattice part includes a second dopant having a second doping concentration, wherein the second doping concentration is greater than the first doping concentration.

In some embodiments, the epitaxial stack further includes a third superlattice part on the second superlattice part, wherein the third superlattice part includes several third units repetitively stacked M3 times on the second superlattice part. Each of the third units includes a fifth sub-layer and a sixth sub-layer on the fifth sub-layer. The fifth sub-layer includes an $Al_{y3}Ga_{1-y3}N$ layer with a thickness of b3 nanometers (nm), and the sixth sub-layer including an $Al_{x3}Ga_{1-x3}N$ layer with a thickness of a3 nanometers (nm), wherein y3 is less than x3. Also, M3 is an positive integer, y3 is greater than 0 and less than 1, x3 is greater than 0 and equal to or less than 1. Also, x2 is less than x3, or x2 is equal to x3 and y2 is less than y3.

In some embodiments, a2 is less than a3, and b2 is greater than b3.

In some embodiments, y3 is greater than y2, y2 is greater than y1 (i.e. y3>y2>y1), b3 is greater than b2, and b2 is greater than b1 (i.e. b3>b2>b1). Also, in these embodiments, a1 is equal to or greater than a2, and a2 is equal to or greater than a3 (i.e. a1≥a2≥a3).

In some embodiments, an overall thickness (S1) of the first superlattice part is less than an overall thickness (S2) of the second superlattice part, and the overall thickness (S2) of the second superlattice part is less than an overall thickness (S3) of the third superlattice part.

According to some embodiments, a high-electron mobility transistor (HEMT) device includes a semiconductor structure as described above; a first insulating layer on the epitaxial stack; a gate electrode on the first insulating layer; and a second insulating layer on the first insulating layer, wherein the second insulating layer conformally covers the gate electrode. The HEMT device also includes a source electrode and a drain electrode at two opposite sides of the gate electrode, wherein the source electrode and the drain electrode penetrate the second insulating layer and the first insulating layer. The HEMT device further includes a third insulating layer on the second insulating layer, wherein the third insulating layer conformally covers the source electrode and the drain electrode.

Some embodiments of the present disclosure provide a method for forming a semiconductor structure. The method includes providing a substrate; forming a seed layer on the substrate; and forming an epitaxial stack on the seed layer by epitaxial growth. The epitaxial stack as formed includes a first superlattice part on the seed layer and a second superlattice part on the first superlattice part. The first superlattice part includes several first units repetitively stacked M1 times on the seed layer, and each of the first units includes a first sub-layer and a second sub-layer on the first sub-layer. The first sub-layer includes an $Al_{y1}Ga_{1-y1}N$ layer with a thickness of b1 nanometers (nm), and the second sub-layer includes an $Al_{x1}Ga_{1-x1}N$ layer with a thickness of a1 nanometers (nm), wherein y1 is less than x1. The second superlattice part includes several second units repetitively stacked M2 times on the first superlattice part, and each of the second units includes a third sub-layer and a fourth sub-layer on the third sub-layer. The third sub-layer includes an $Al_{y2}Ga_{1-y2}N$ layer with a thickness of b2 nanometers (nm), and the fourth sub-layer includes an $Al_{x2}Ga_{1-x2}N$ layer with a thickness of a2 nanometers (nm), wherein y2 is less than x2. In some embodiments, M1 and M2 are positive integers, x1, y1 and y2 are greater than 0 and less than 1, x2 is greater than 0 and equal to or less than 1. Also, x1 is less than x2. Alternatively, x1 is equal to x2, and y1 is less than y2.

According to some embodiments, after the epitaxial stack is formed, the method for forming the semiconductor structure further includes performing a cooling step on the structure containing the substrate, the seed layer and the epitaxial stack. In some embodiments, the vertical height difference between the center of the top surface of the forming structure and the edge of the top surface of the forming structure is in a range of −10 μm to +10 μm after the cooling step is performed.

A detailed description is given in the following embodiments with reference to the accompanying drawings.

BRIEF DESCRIPTION OF THE DRAWINGS

The embodiments of the disclosure can be more fully understood by reading the subsequent detailed description and examples with references made to the accompanying drawings. For clarity of illustration, various elements in the drawings may not be drawn to scale, wherein.

DETAILED DESCRIPTION

Figure 1A:
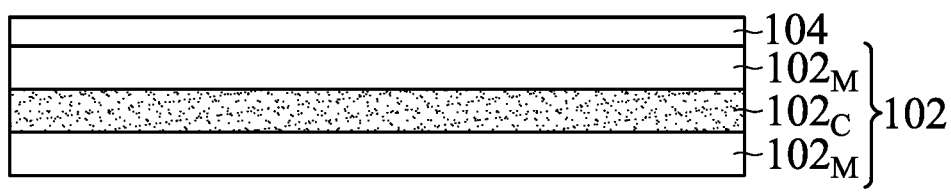
FIG. 1A-FIG. 1E illustrate cross-sectional views of intermediate stages of a method of forming a semiconductor structure in accordance with some embodiments of the present disclosure.

The following description provides various embodiments, or examples, for implementing different features of the present disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numbers and/or letters in the various examples. This repetition is for the purpose of simplicity and clarity and does not in itself dictate a relationship between the various embodiments and/or configurations discussed.

Furthermore, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some embodiments are described below. Throughout the various views and illustrative embodiments, similar reference numbers are used to designate similar features/components. It should be understood that additional operations can be provided before, during, and after the method, and some of the operations can be replaced or eliminated for other embodiments of the method.

The terms "about", "approximately", and "substantially" used herein generally refer to a value of an error or a range within 20 percent, preferably within 10 percent, and more preferably within 5 percent. If there is no specific description, the mentioned values are regarded as an approximation that is the error or the range expressed as "about", "approximately", or "substantially".

Embodiments provide semiconductor structures and methods for forming the same. In some embodiments, an epitaxial stack is formed on the substrate, and the epitaxial stack includes at least two superlattice parts. In some embodiments, each of the superlattice parts includes several units repetitively stacked, and each unit includes two sub-layers, wherein those sub-layers are alternately stacked above the substrate. According to the embodiments, the sub-layers of the superlattice parts include aluminum nitride and/or aluminum gallium nitride, wherein the mole fraction of aluminum in aluminum gallium nitride of one sub-layer of the superlattice part that is closer to the substrate is smaller than the mole fraction of aluminum in aluminum nitride or aluminum gallium nitride of another sub-layer of another superlattice part that is farther from the substrate. For example, according to some embodiments, a sub-layer (such as the second sub-layer 1062 described later) of the first superlattice part that is closer to the substrate has aluminum mole fraction x1 in aluminum gallium nitride, and a sub-layer (such as the fourth sub-layer 1064 described later) of the second superlattice part that is farther from the substrate has the aluminum mole fraction x2 in aluminum nitride or aluminum gallium nitride, wherein x1 is less than x2.

The semiconductor structure according to the embodiments of the present disclosure can significantly reduce the wafer curvature. Therefore, the superlattice structures of the embodiments effectively prevent the wafer from cracking, thereby improving the electrical performance of each of the semiconductor devices (such as transistors) fabricated on the wafer and improving electrical uniformity between the semiconductor devices fabricated on the wafer. Consequently, the production yield of the semiconductor devices can be greatly increased. In some of the embodiments described below, a high electron mobility transistor (HEMT) is used to illustrate a semiconductor structure. However, the present disclosure is not limited thereto. Some embodiments of the present disclosure can be applied to other types of semiconductor structures.

FIG. 1A-FIG. 1E illustrate cross-sectional views of intermediate stages of a method of forming a semiconductor structure in accordance with some embodiments of the present disclosure. Referring to FIG. 1A, a substrate 102 is provided. For example, the substrate 102 is a semiconductor-on-insulator (SOI) substrate. In some embodiments, the substrate 102 includes a base $102_C$ and an insulating layer $102_M$ encapsulating the base $102_C$. In some embodiments, the base $102_C$ of the substrate 102 includes a ceramic material. The ceramic material may include a metal inorganic material. In some embodiments, the base $102_C$ includes silicon carbide (SiC), aluminum nitride, sapphire, or another suitable material. The aforementioned sapphire base may comprise aluminum oxide. In some embodiments, the insulating layer $102_M$ includes a single insulating material layer or several insulating material layers. Also, the insulating layer $102_M$ covers all of the surfaces (the top surface, the bottom surfaces and all of the side surfaces) of the base $102_C$. The insulating material layer(s) may include an oxide, a nitride, an oxynitride, or another suitable material. In some other embodiments, the insulating layer $102_M$ encapsulating all of the surfaces of the base $102_C$ may further include another suitable material layer, such as a semiconductor layer. In some embodiments, the semiconductor layer of the insulating layer $102_M$ may be a polysilicon layer disposed between the insulating material layers. To simplify the drawings, a single insulating material layer in FIG. 1A-FIG. 1E is exemplified as the insulating layer $102_M$ for illustrating a process for forming the semiconductor structure according to some embodiments of the present disclosure.

Next, referring to FIG. 1A again, a seed layer 104 is formed on the substrate 102. In some embodiments, the seed layer 104 is made of silicon (Si), aluminum nitride (AlN), or another applicable material. Also, the seed layer 104 may include a single material layer or several suitable material layers. For example, the seed layer 104 may include an aluminum nitride layer grown on the substrate 102 at a low temperature and another aluminum nitride layer grown at a high temperature. In some embodiments, the aluminum nitride layer grown at a low temperature may have a thickness of about 1 nm, and another aluminum nitride layer grown at a high temperature may have a thickness of about 200 nm. To simplify the drawings, a single material layer in FIG. 1A-FIG. 1E is exemplified as the seed layer 104 for illustrating a method for forming the semiconductor structure according to some embodiments of the present disclosure.

In some embodiments, the methods for forming the seed layer 104 include a selective epitaxial growth (SEG) process, a chemical vapor deposition (CVD) process, a molecular beam epitaxy (MBE) process, deposition of doped amorphous semiconductor (e.g., Si) followed by a solid-phase epitaxial recrystallization (SPER) step, methods of directly pasting seed crystals, or another applicable process. The CVD process may include a vapor-phase epitaxy (VPE) process, a low pressure CVD (LPCVD) process, an ultra-high vacuum CVD (UHV-CVD) process, or another applicable process.

Next, an epitaxial stacking layer is formed on the seed layer 104. In some embodiments, the epitaxial stacking layer of a high electron mobility transistor (HEMT) includes a buffer layer, a channel layer and a barrier layer. Formation of the buffer layer may be helpful to mitigate the strain on a channel layer that is subsequently formed on the buffer layer, and to prevent defects from forming in the overlying channel layer.

Figure 1B:
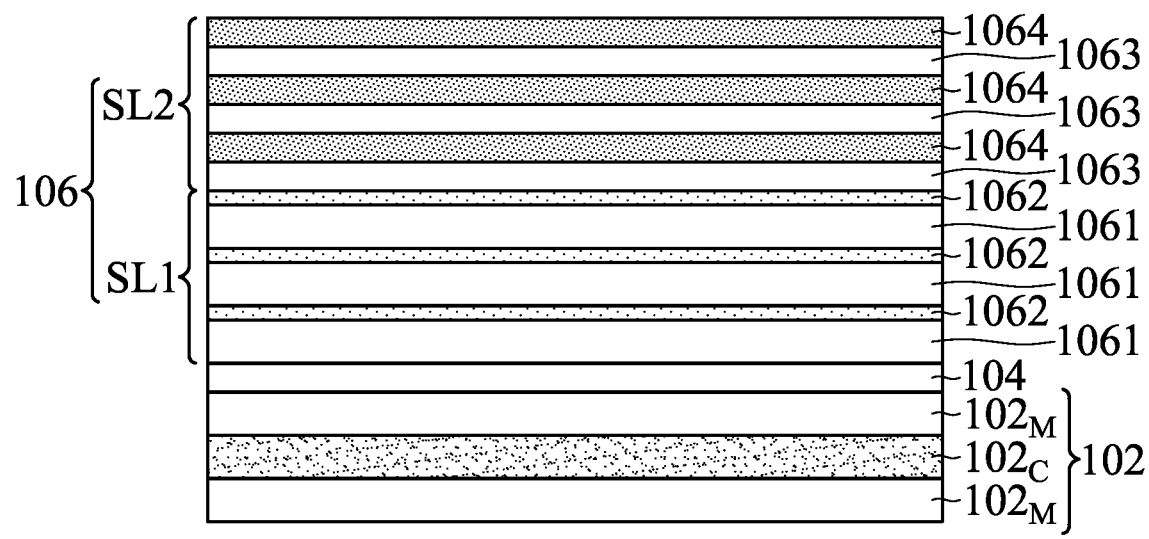

Referring to FIG. 1B, the buffer layer 106 includes at least two superlattice parts in accordance with some embodiments of the present disclosure, thereby mitigate the strain on the channel layer. As shown in FIG. 1B, a first superlattice part SL1 is formed on the seed layer 104 and a second superlattice part SL2 formed on the first superlattice part SL1.

In some embodiments, the first superlattice part SL1 includes several first units repetitively stacked M1 times on the seed layer 104. Each of the first units includes two sub-layers. That is, a first sub-layer 1061 and a second sub-layer 1062 on the first sub-layer 1061. In some embodiments, the first sub-layer 1061 including an $Al_{y1}Ga_{1-y1}N$ layer with a thickness of b1 nanometers (nm), and the second sub-layer 1062 includes an $Al_{x1}Ga_{1-x1}N$ layer with a thickness of a1 nanometers (nm), wherein y1 is less than x1.

In some embodiments, the second superlattice part SL2 includes several second units repetitively stacked M2 times on the first superlattice part SL1. Each of the second units includes two sub-layers. That is, a third sub-layer 1063 and a fourth sub-layer 1064 on the third sub-layer 1063. In some embodiments, the third sub-layer 1063 including an $Al_{y2}Ga_{1-y2}N$ layer with a thickness of b2 nanometers (nm), and the fourth sub-layer 1064 includes an $Al_{x2}Ga_{1-x2}N$ layer with a thickness of a2 nanometers (nm), wherein y2 is less than x2.

In the above descriptions, M1 and M2 are positive integers, x1, y1 and y2 are greater than 0 and less than 1, x2 is greater than 0 and equal to or less than 1. Also, in some embodiments, x1 is less than x2. In some other embodiments, x1 is equal to x2, and y1 is less than y2. To simplify the drawings, three stacked first units and three stacked second units (M1=M2=3) are exemplified for illustrating a method for forming the semiconductor structure according to some embodiments of the present disclosure. It is noted that the present disclosure is not limited to those stacked times of the first and second units.

Also, according to some embodiments of the present disclosure, the first superlattice part SL1 can be represented as:

number of repetitively stacked times×[the superlattice structure of the second sub-layer/the superlattice structure of the first sub-layer].

According to some embodiments of the present disclosure, the second superlattice part SL2 can be represented as:

number of repetitively stacked times×[the superlattice structure of the fourth sub-layer/the superlattice structure of the third sub-layer].

That is, in this embodiment, the first superlattice part SL1 can be represented as:

$$M1\times[a1(nm)Al_{x1}Ga_{1-x1}N/b1(nm)Al_{y1}Ga_{1-y1}N],$$

wherein a1 is a thickness (e.g. nm) of the single second sub-layer 1062, b1 is a thickness (e.g. nm) of the single first sub-layer 1061, and M1 is the number of repetitively stacked times of the first units. In one example, M1 is greater than 20.

In this embodiment, the second superlattice part SL2 can be represented as:

$$M2\times[a2(nm)Al_{x2}Ga_{1-x2}N/b2(nm)Al_{y2}Ga_{1-y2}N],$$

wherein a2 is a thickness (e.g. nm) of the single fourth sub-layer 1064, b2 is a thickness (e.g. nm) of the single third sub-layer 1063, and M2 is the number of repetitively stacked times of the second units. In one example, M2 is greater than 20.

In some embodiments, x2 is greater than 0 and equal to or less than 1, and x1 is greater than 0 and less than 1. Also, the mole fraction x1 of aluminum in aluminum gallium nitride ($Al_{x1}Ga_{1-x1}N$) of the second sub-layer 1062 of the first superlattice part SL1 that is closer to the substrate 102 is smaller than the mole fraction x2 of aluminum in aluminum nitride or aluminum gallium nitride ($Al_{x1}Ga_{1-x2}N$) of the fourth sub-layer 1064 of the second superlattice part SL2 that is farther from the substrate 102 (i.e. x1<x2). In some other embodiments, x1 is equal to x2, and y1 is less than y2. According to the superlattice structures of the first superlattice part SL1 and the second superlattice part SL2, the wafer curvature can be reduced, and wafer cracking can be avoided, thereby obtaining a crack-free wafer.

Also, the sub-layer having a higher mole fraction of aluminum in the second superlattice part SL2 (farther from the substrate 102) is thicker than the sub-layer having a higher mole fraction of aluminum in the first superlattice part SL1 (closer to the substrate 102), so that the tensile stress of the second superlattice part SL2 can be increased. In some embodiments, a1 is less than a2. That is, the thickness a1 (nm) of the second sub-layer 1062 is less than the thickness a2 (nm) of the fourth sub-layer 1064 (i.e. a1<a2). Therefore, the tensile stress of the second superlattice part SL2 is greater than the tensile stress of the first superlattice part SL1.

In some embodiments, y2 is greater than 0 and equal to or less than 1, y1 is greater than 0 and less than 1, and y1 is less than y2. That is, the mole fraction y1 of aluminum in aluminum gallium nitride ($Al_{y1}Ga_{1-y1}N$) of the first sub-layer 1061 of the first superlattice part SL1 that is closer to the substrate 102 is smaller than the mole fraction y2 of aluminum in aluminum gallium nitride ($Al_{y2}Ga_{1-y2}N$) of the third sub-layer 1063 of the second superlattice part SL2 that is farther from the substrate 102 (i.e. y1<y2).

Also, in some embodiments, a1 is less than a2, and b1 is greater than b2. That is, the thickness b1 (nm) of the first sub-layer 1061 containing aluminum gallium nitride is greater than the thickness b2 (nm) of the third sub-layer 1063 containing aluminum gallium nitride (i.e. b1>b2), so that the tensile stress of the second superlattice part SL2 can be increased.

In some other embodiments, a1 is equal to or greater than a2, and b2 is greater than b1, so that the tensile stress of the second superlattice part SL2 can also be increased.

In some other embodiments, x1 is greater than y1, and x2 is greater than y2. That is, the mole fraction x1 of aluminum in aluminum gallium nitride ($Al_{x1}Ga_{1-x1}N$) of the second sub-layer 1062 of the first superlattice part SL1 is greater than the mole fraction y1 of aluminum in aluminum gallium nitride ($Al_{y1}Ga_{1-y1}N$) of the first sub-layer 1061 of the first superlattice part SL1. The mole fraction x2 of aluminum in aluminum nitride or aluminum gallium nitride ($Al_{x2}Ga_{1-x2}N$) of the fourth sub-layer 1064 of the second superlattice part SL2 is greater than the mole fraction y2 of aluminum in aluminum gallium nitride ($Al_{y2}Ga_{1-y2}N$) of the third sub-layer 1063 of the second superlattice part SL2.

Also, in some embodiments, x1 is in a range of 0.6 to 1, and x2 is in a range of 0.8 to 1. In some embodiments, y1 is in a range of 0.1 to 0.3, and y2 is in a range of 0.15 to 0.4. Four experiments are performed, and the ranges of aluminum mole fractions of the sub-layers of two superlattice parts of the semiconductor structure, in accordance with some embodiments, are listed in Table 1. In Experiment 1, x1 is less than x2, and y1 is less than y2. In Experiment 2, x1 is equal to x2, and y1 is less than y2. In Experiment 3, x1 is less than x2, and y1 is less than y2. In Experiment 4, x1 is less than x2, and y1 is equal to y2.

TABLE 1

|  | x1 | y1 | x2 | y2 |
| --- | --- | --- | --- | --- |
| Experiment 1 | 0.6~0.7 | 0.1~0.3 | 0.8~0.9 | 0.15~0.4 |
| Experiment 2 | 0.8~1 | 0.1~0.3 | 0.8~1 | 0.15~0.4 |
| Experiment 3 | 0.8~0.9 | 0.1~0.15 | 0.9~1 | 0.2~0.25 |
| Experiment 4 | 0.8~0.9 | 0.15~0.25 | 0.9~1 | 0.15~0.25 |

In some embodiments, M1 is less than M2. That is, the repetitively stacked times M1 of the first units of the first superlattice part SL1 is less than the repetitively stacked times M2 of the second units of the second superlattice part SL2.

Also, in some embodiments, after epitaxial growth of the above sub-layers to form the buffer layer 106 as shown in FIG. 1B, the overall thickness of the first superlattice part SL1 is less than the overall thickness of the second superlattice part SL2.

According to the aforementioned descriptions, the superlattice structures of the first superlattice part SL1 and the second superlattice part SL2, in accordance with some embodiments of the present disclosure, can significantly reduce the wafer curvature. For example, the vertical height difference between the center of the top surface and the edge of the top surface of the wafer can be in a range of −10 μm to +10 μm. Also, the superlattice structures of the embodiments also prevent the wafer from cracking, thereby improving the electrical performance of each of the semiconductor devices (such as transistors) fabricated on the wafer. Also, the electrical uniformity between the semiconductor devices fabricated on the wafer can be significantly improved, thereby increasing the production yield of the semiconductor devices.

In addition, the superlattice parts can further include suitable dopants, and the doping concentration of the superlattice part that is farther from the substrate 102 can be greater than the doping concentration of the superlattice part that is closer to the substrate 102. In some embodiments, the first superlattice part SL1 further includes the first dopant having the first doping concentration, and the second superlattice part SL2 further includes the second dopant having the second doping concentration, wherein the second doping concentration is greater than the first doping concentration. In some embodiments, those dopants, such as the first dopant and the second dopant, are independently selected from carbon or iron.

In some embodiments, each of the sub-layers of the above mentioned first superlattice part SL1 and the second superlattice part SL2 may be formed using a hydride vapor phase epitaxy method (HVPE), a molecular-beam epitaxy method (MBE), a metalorganic chemical vapor deposition method (MOCVD), other applicable methods, or a combination thereof.

Although the buffer layer 106 shown in FIG. 1B includes two superlattice parts, the present disclosure is not limited thereto. In some other embodiments, the buffer layer 106 may include three or more superlattice parts.

Figure 1C:
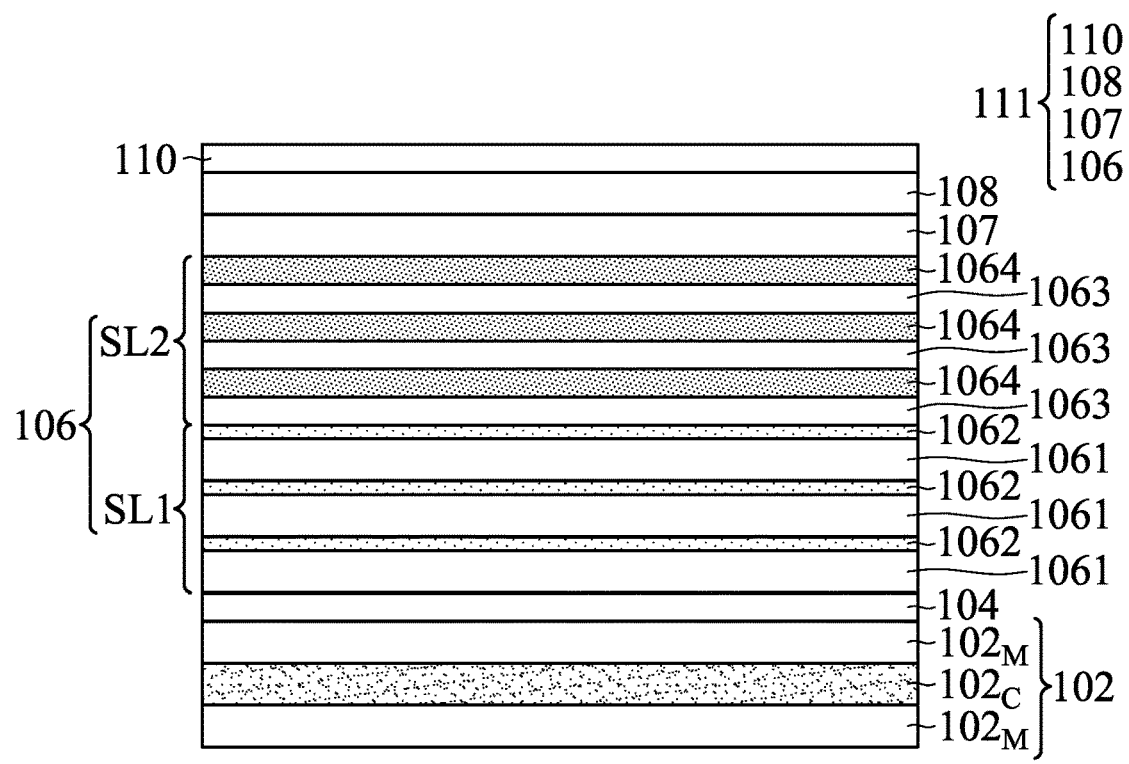

Next, referring to FIG. 1C, a channel layer 108 is formed on the buffer layer 106 by epitaxial growth. In some embodiments, the channel layer 108 includes an undoped III-V group compound semiconductor material. For example, the channel layer 108 is made of undoped GaN, but the present disclosure is not limited thereto. In some other embodiments, the channel layer 108 includes AlGaN, AlN, GaAs, GaInP, AlGaAs, InP, InAlAs, InGaAs, other applicable III-V group compound materials, or a combination thereof. In some embodiments, the channel layer 108 is formed using a molecular-beam epitaxy method (MBE), a hydride vapor phase epitaxy method (HVPE), a metalorganic chemical vapor deposition method (MOCVD), other applicable methods, or a combination thereof. In this example, the channel layer 108 is a gallium nitride layer having a thickness of about 400 nm.

Next, a barrier layer 110 is formed on the channel layer 108 by epitaxial growth. In some embodiments, the barrier layer 110 includes an undoped III-V group compound semiconductor material. For example, the barrier layer 110 includes undoped $Al_xGa_{1-x}N$ (wherein 0<x<1), but the present disclosure is not limited thereto. In some other embodiments, the barrier layer 110 includes GaN, AlN, GaAs, GaInP, AlGaAs, InP, InAlAs, InGaAs, other applicable III-V group compound materials, or a combination thereof. The barrier layer 110 may be formed using a molecular-beam epitaxy method (MBE), a metalorganic chemical vapor deposition method (MOCVD), a hydride vapor phase epitaxy method (HVPE), other applicable methods, or a combination thereof. In this example, the barrier layer 110 is an aluminum gallium nitride layer having a thickness of about 12.5 nm.

Therefore, an epitaxial stack 111 on the seed layer 104 of a high electron mobility transistor (HEMT) in accordance with some embodiments includes a buffer layer 106, a channel layer 108 and a barrier layer 110, as shown in FIG. 1C.

Also, in some embodiments, the epitaxial layer 111 is a GaN-containing composite layer. However, the present disclosure is not limited thereto. Besides the buffer layer 106, the channel layer 108 and the barrier layer 110, the epitaxial layer 111 may further include other films and/or layers. In some other embodiments, a carbon-doped layer is further formed between the buffer layer 106 and the channel layer 108 to increase the breakdown voltage of the semiconductor structure. As shown in FIG. 1C, a carbon-containing gallium nitride (C—GaN) layer 107 is formed on the second superlattice part SL2 by epitaxial growth. The carbon-containing gallium nitride (C—GaN) layer 107 functions as an electrical buffer layer. The channel layer 108 is formed on the carbon-containing GaN layer 107.

In some embodiments, the channel layer 108 and the barrier layer 110 include different materials from each other such that a heterojunction is formed between the channel layer 108 and the barrier layer 110. For example, the channel layer 108 is a gallium nitride (GaN) layer, and the barrier layer 110 is an aluminum gallium nitride (AlGaN) layer. Therefore, a two-dimensional electron gas (2DEG) which is generated by the band gap between the hetero-materials may be formed at the interface between the channel layer 108 and the barrier layer 110. In some embodiments, the semiconductor structures, such as high electron mobility transistors (HEMTs), may utilize 2DEG as conductive carriers.

After growing the above epitaxial material layers (for example, including the buffer layer 106, the carbon-containing gallium nitride (C—GaN) layer 107, the channel layer 108 and the barrier layer 110), these material layers are cooled. After cooling, the elements as required for forming a semiconductor device are subsequently formed on the epitaxial layer 111.

Figure 1D:
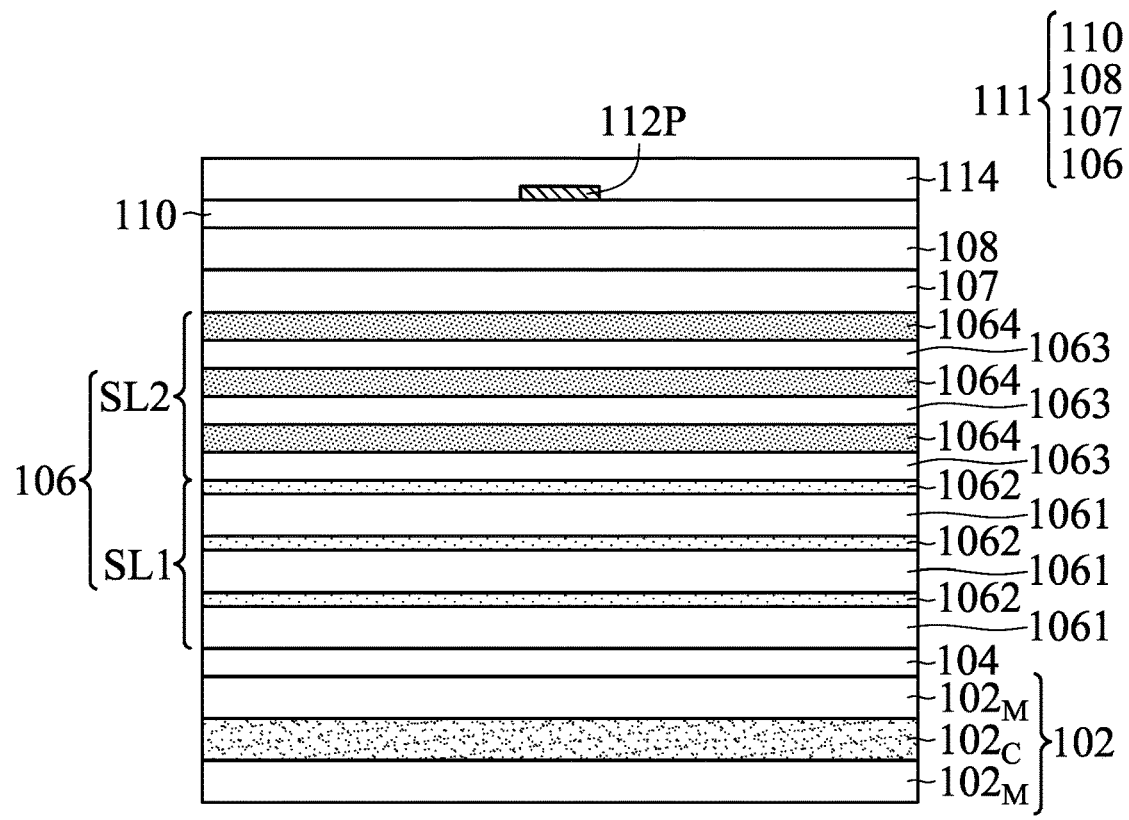
Figure 1E:
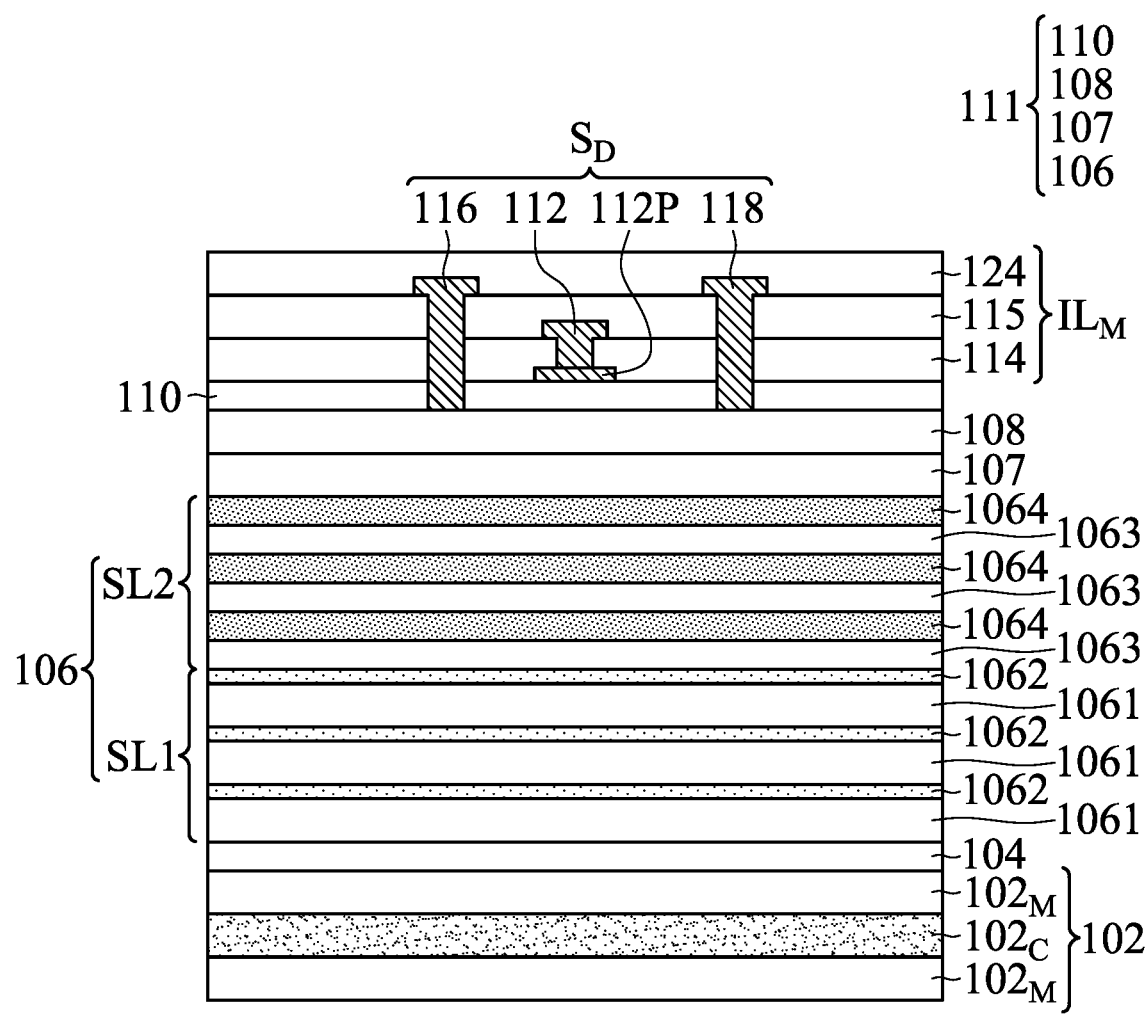

In some embodiments, a semiconductor device, such as a high electron mobility transistors (HEMT), is formed on the epitaxial layer 111, and an interlayer dielectric layer $IL_M$ is formed to cover the semiconductor device (e.g. a semiconductor device SD and an interlayer dielectric layer $IL_M$ as shown in subsequent FIG. 1E, where the interlayer dielectric layer $IL_M$ includes multiple insulating layers).

In some embodiments, the semiconductor device SD includes a gate electrode, a source electrode 116 and a drain electrode 118 at two opposite sides of the gate electrode. According to some embodiments of the present disclosure, an enhanced mode (i.e. normally-off) high-electron mobility transistor (HEMT) is exemplified for describing one type of the semiconductor device SD. In some embodiments, a doped III-V group compound semiconductor material is formed on the barrier layer 110, and a patterning process is performed to form a doped III-V group compound semiconductor 112P, wherein the doped III-V group compound semiconductor 112P is under a gate electrode formed later.

As shown in FIG. 1D, a doped III-V group compound semiconductor 112P is formed on the barrier layer 110. In some embodiments, the doped III-V group compound semiconductor 112P may include suitable dopants, such as p-type doping gallium nitride (GaN). In some other embodiments, the doped III-V group compound semiconductor 112P may include p-type doping aluminium gallium nitride (AlGaN), gallium nitride (GaN), aluminium nitride (AlN), gallium arsenide (GaAs), gallium indium phosphide (GaInP), aluminium gallium arsenide (AlGaAs), indium phosphide (InP), indium aluminum arsenide (InAlAs), indium gallium arsenide (InGaAs), another suitable III-V group compound material, or a combination thereof. In addition, the methods for forming the doped III-V group compound semiconductor 112P may include the atomic layer deposition (ALD), chemical vapor deposition (CVD), physical vapor deposition (PVD), epitaxy processes, ion implantation or in-situ doping processes. In this example, the doped III-V group compound semiconductor 112P is a p-type doping gallium nitride (p-GaN) layer having a thickness of about 80 nm.

Next, as shown in FIG. 1D, in some embodiments, a first insulating layer 114 is formed on the epitaxial layer 111 and conformally covers the doped III-V group compound semiconductor 112P. In some embodiments, the first insulating layer 114 may be made of silicon oxide, silicon nitride, silicon oxynitride, or another suitable dielectric material. In addition, the first insulating layer 114 may be formed by chemical vapor deposition (CVD), physical vapor deposition (PVD), atomic layer deposition (ALD), high-density plasma chemical vapor deposition (HDP-CVD), or a combination thereof.

As shown in FIG. 1E, a gate electrode 112 is formed on the first insulating layer 114, and the gate electrode 112 is connected to the doped III-V group compound semiconductor 112P. In some embodiments, the gate electrode 112 is made of metal, metal silicide, polysilicon, another suitable material, or a combination thereof. The gate electrode 112 and the doped III-V group compound semiconductor 112P may have Schottky contact formed therebetween. In some embodiments, the gate electrode 112 is formed by atomic layer deposition (ALD), chemical vapor deposition (CVD), physical vapor deposition (PVD)(such as sputtering), or the like.

In some embodiments, the second insulating layer 115 is formed on the first insulating layer 114, and the second insulating layer 115 conformally covers the first insulating layer 114, as shown in FIG. 1E. The methods and materials for forming the second insulating layer 115 may be similar to, or the same as the methods and materials for forming the first insulating layer 114, and are not repeated herein.

A source electrode 116 and a drain electrode 118 are subsequently formed at two opposite sides of the gate electrode 112, as shown in FIG. 1E. In some embodiments, the source electrode 116 and the drain electrode 118 are formed on the channel layer 108 and electrically contact the channel layer 108. In some embodiments, the source electrode 116 and the drain electrode 118 include one or more conductive materials, such as Au, Ni, Pt, Pd, Ir, Ti, Cr, W, Al, Cu, TaN, TiN, $WSi_2$, a combination thereof, or the like. In some embodiments, the conductive material of the source electrode 116 and the drain electrode 118 may be formed by atomic layer deposition (ALD), chemical vapor deposition (CVD), physical vapor deposition (PVD)(such as sputtering), electron beam evaporation, or the like. In some embodiments, after the conductive material of the source electrode 116 and the drain electrode 118 is deposited, a high-temperature thermal process such as an annealing process is performed to form source/drain ohmic contacts. In some embodiments, the high-temperature thermal process is a rapid thermal annealing process.

Next, as shown in FIG. 1E, in some embodiments, a third insulating layer 124 is formed on the second insulating layer 115, and the third insulating layer 124 conformally covers the source electrode 116 and the drain electrode 118. The methods and materials for forming the third insulating layer 124 may be similar to, or the same as the methods and materials for forming the first insulating layer 114, and are not repeated herein. The first dielectric layer 114, the second dielectric layer 116 and the third dielectric layer 118 form an interlayer dielectric ($IL_M$) layer to cover the semiconductor device $S_D$.

Figure 2:
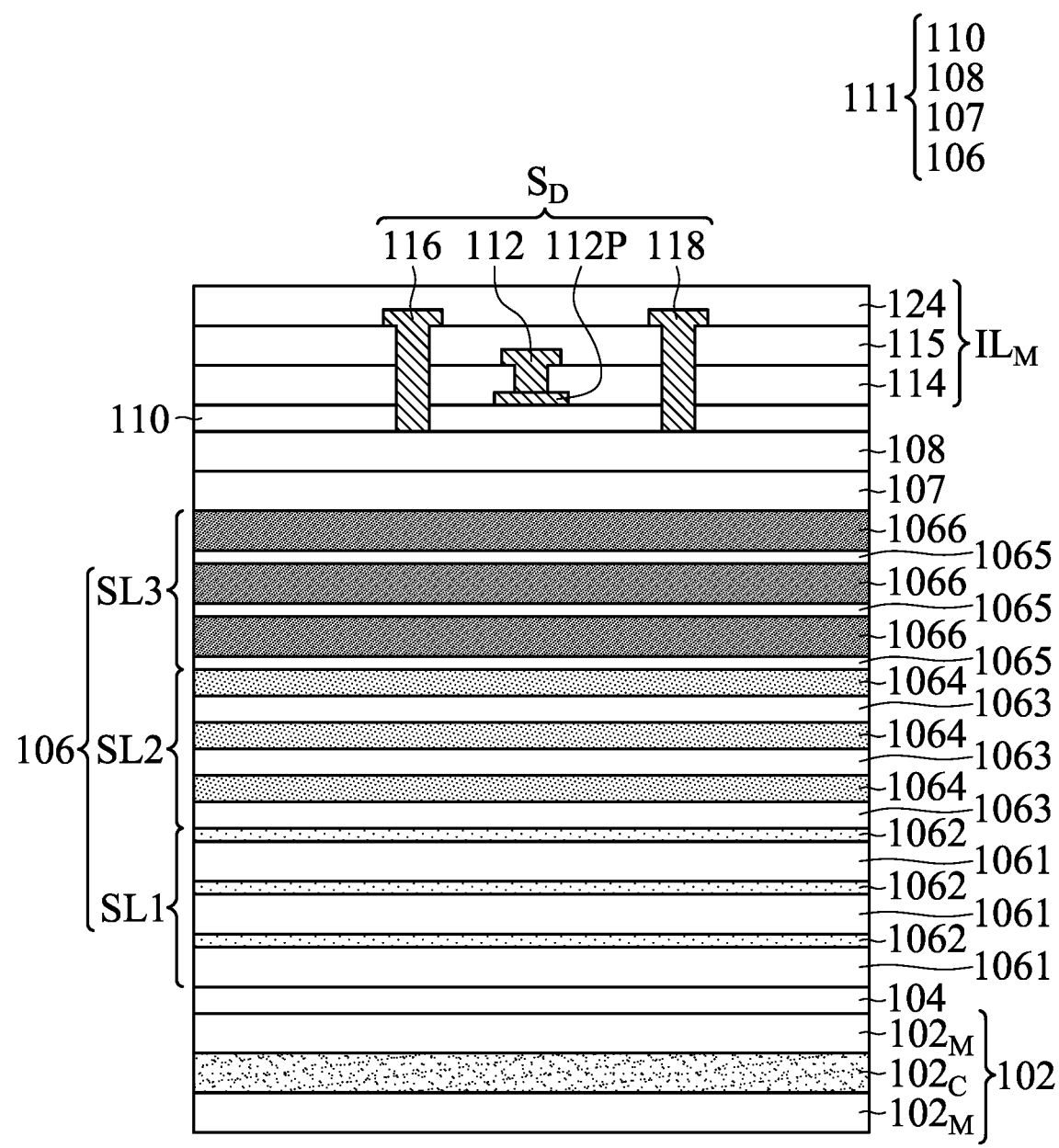
FIG. 2 illustrates a cross-sectional view of another semiconductor structure in accordance with some embodiments of the present disclosure.

FIG. 2 illustrates a cross-sectional view of another semiconductor structure in accordance with some embodiments of the present disclosure. In some embodiments as illustrated in FIG. 1A-FIG. 1E, the buffer layer 106 includes two superlattice parts. In some embodiments as illustrated in FIG. 2, the buffer layer 106 includes three superlattice parts.

Referring to FIG. 2, the buffer layer 106 includes a first superlattice part SL1 is formed on the seed layer 104, a second superlattice part SL2 formed on the first superlattice part SL1, and a third superlattice part SL3 formed on the second superlattice part SL2.

The first superlattice part SL1 includes several first units repetitively stacked M1 times on the seed layer 104. Each of the first units includes a first sub-layer 1061 and a second sub-layer 1062 on the first sub-layer 1061. In some embodiments, the first sub-layer 1061 including an $Al_{y1}Ga_{1-y1}N$ layer with a thickness of b1 nanometers (nm), and the second sub-layer 1062 includes an $Al_{x1}Ga_{1-x1}N$ layer with a thickness of a1 nanometers (nm), wherein y1 is less than x1.

The second superlattice part SL2 includes several second units repetitively stacked M2 times on the first superlattice part SL1. Each of the second units includes a third sub-layer 1063 and a fourth sub-layer 1064 on the third sub-layer 1063. In some embodiments, the third sub-layer 1063 including an $Al_{y2}Ga_{1-y2}N$ layer with a thickness of b2 nanometers (nm), and the fourth sub-layer 1064 includes an $Al_{x2}Ga_{1-x2}N$ layer with a thickness of a2 nanometers (nm), wherein y2 is less than x2.

The third superlattice part SL3 includes several second units repetitively stacked M3 times on the second superlattice part SL2. Each of the third units includes a fifth sub-layer 1065 and a sixth sub-layer 1066 on the fifth sub-layer 1065. In some embodiments, the fifth sub-layer 1065 including an $Al_{y3}Ga_{1-y3}N$ layer with a thickness of b3 nanometers (nm), and the sixth sub-layer 1066 includes an $Al_{x3}Ga_{1-x3}N$ layer with a thickness of a3 nanometers (nm), wherein y3 is less than x3.

Similarly, the third superlattice part SL3 can be represented as:

$$M3 \times [a3(nm)Al_{x3}Ga_{1-x3}N/b3(nm)Al_{y3}Ga_{1-y3}N],$$

wherein a3 is a thickness (e.g. nm) of the single fifth sub-layer 1065, b3 is a thickness (e.g. nm) of the single sixth sub-layer 1066, and M3 is the number of repetitively stacked times of the third units. In one example, M3 is greater than 20.

In some embodiments, M1, M2 and M3 are positive integers, each of x1, y1, y2 and y3 is greater than 0 and less than 1, x2 is greater than 0 and equal to or less than 1, and x3 is greater than 0 and equal to or less than 1, wherein x1<x2<x3. In other words, the mole fraction x3 of aluminum in aluminum gallium nitride ($Al_{x3}Ga_{1-x3}N$) of the sixth sub-layer 1066 of the third superlattice part SL3 that is farther from the substrate 102 is greater than the mole fraction x2 of aluminum in aluminum nitride or aluminum gallium nitride ($Al_{x2}Ga_{1-x2}N$) of the fourth sub-layer 1064 of the second superlattice part SL2, and also greater than the mole fraction x1 of aluminum in aluminum gallium nitride ($Al_{x1}Ga_{1-x1}N$) of the second sub-layer 1062 of the first superlattice part SL1 that is closer to the substrate 102 (i.e. 0<x1<x2<x3≤1). In some other embodiments, x1 is less than x2, x2 is equal to x3, y1 is less than y2, and y2 is less than y3.

In addition, the sub-layer having a higher mole fraction of aluminum in the third superlattice part SL3 that is farther from the substrate 102 is thicker than the sub-layer having a higher mole fraction of aluminum in the second superlattice part SL2, and is also thicker than the sub-layer having a higher mole fraction of aluminum in the first superlattice part SL1 that is closer to the substrate 102. That is, a1<a2<a3. Also, in some embodiments, b1>b2>b3; that is, the thickness b1 (nm) of the first sub-layer 1061 is greater than the thickness b2 (nm) of the third sub-layer 1063, and the thickness b2 (nm) of the third sub-layer 1063 is greater than the thickness b3 (nm) of the fifth sub-layer 1065. Therefore, the tensile stress of the third superlattice part SL3 is greater than the tensile stress of the second superlattice part SL2, and the tensile stress of the second superlattice part SL2 is greater than the tensile stress of the first superlattice part SL1.

Also, in some other embodiments, a1 is equal to or greater than a2, a2 is equal to or greater than a3 (a1≥a2≥a3), b3 is greater than b2, and b2 is greater than b1 (b3>b2>b1). Therefore, the tensile stress of the second superlattice part SL2 is greater than the tensile stress of the first superlattice part SL1, and the tensile stress of the third superlattice part SL3 is greater than the tensile stress of the second superlattice part SL2.

In some embodiments, each of y1, y2 and y3 is greater than 0 and less than 1. Also, y1 is less than y2, and y2 is less than y3 (i.e. y1<y2<y3). That is, the mole fraction y1 of aluminum in aluminum gallium nitride ($Al_{y1}Ga_{1-y1}N$) of the first sub-layer 1061 of the first superlattice part SL1 that is closer to the substrate 102 is less than the mole fraction y2 of aluminum in aluminum gallium nitride ($Al_{y2}Ga_{1-y2}N$) of the third sub-layer 1063 of the second superlattice part SL2, and the mole fraction y2 of aluminum in aluminum gallium nitride ($Al_{y2}Ga_{1-y2}N$) of the third sub-layer 1063 of the second superlattice part SL2 is less than the mole fraction y3 of aluminum in aluminum gallium nitride ($Al_{y3}Ga_{1-y3}N$) of the fifth sub-layer 1065 of the third superlattice part SL3.

Also, in some embodiments, x1 is in a range of 0.6 to 1, x2 is in a range of 0.8 to 1, and x3 is in a range of 0.9 to 1. In some embodiments, y1 is in a range of 0.1 to 0.3, y2 is in a range of 0.15 to 0.4, and y3 is in a range of 0.2 to 0.5.

Four experiments are performed, and the ranges of aluminum mole fractions of the sub-layers of three superlattice parts of the semiconductor structure, in accordance with some embodiments, are listed in Table 2. In Experiment 1, x1 is less than x2, x2 is less than x3, y1 is less than y2, and y2 is less than y3. In Experiment 2, x1 is equal to x2, x2 is less than x3, y1 is less than y2, and y2 is less than y3. In Experiment 3, x1 is less than x2, x2 is less than x3, y1 is less than y2, and y2 is less than y3. In Experiment 4, x1 is less than x2, x2 is less than x3, y1 is equal to y2, and y2 is less than y3.

In addition, the superlattice parts can further include suitable dopants, and the doping concentration of the superlattice part that is farther from the substrate 102 can be greater than the doping concentration of the superlattice part that is closer to the substrate 102. In some embodiments, the first superlattice part SL1 further includes the first dopant having the first doping concentration, the second superlattice part SL2 further includes the second dopant having the second doping concentration, and the third superlattice part SL3 further includes the third dopant having the third doping concentration, wherein the second doping concentration is greater than the first doping concentration, and the third doping concentration is greater than the second doping concentration. In some embodiments, those dopants, such as the first dopant, the second dopant and the third dopant, are independently selected from carbon or iron.

The materials and processes for forming the material layers of the structure in FIG. 2 may be similar to, or the same as the materials and processes for forming the material layers of the structure in FIG. 1A-FIG. 1E, and are not repeated herein. According to the aforementioned descriptions as shown in FIG. 2, the superlattice structures of the first superlattice part SL1, the second superlattice part SL2 and the third superlattice part SL3, in accordance with some embodiments of the present disclosure, can significantly reduce the wafer curvature. For example, the vertical height difference between the center of the top surface and the edge of the top surface of the wafer can be reduced to a range of −10 μm to +10 μm, or even a narrower range. Also, the superlattice structures of the embodiments also prevent the wafer from cracking, thereby improving the electrical performance of each of the semiconductor devices (such as transistors) fabricated on the wafer. Also, the electrical uniformity between the semiconductor devices fabricated on the wafer can be significantly improved, thereby increasing the production yield of the semiconductor devices.

Figure 3:
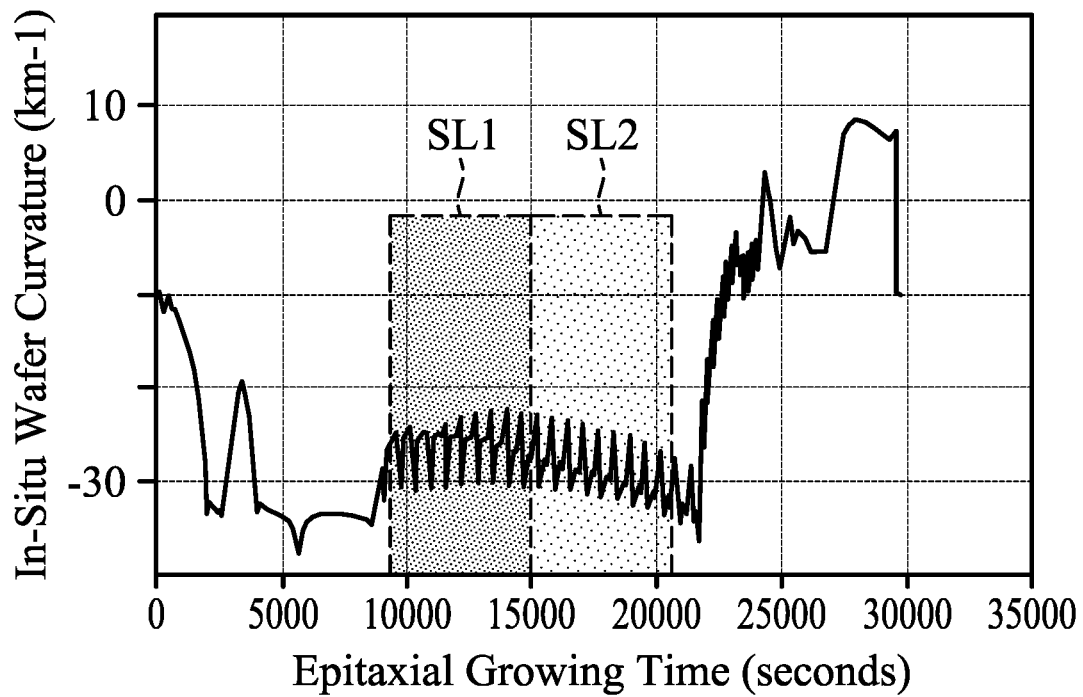
FIG. 3 is a graph of in-situ wafer curvature of a semiconductor structure during epitaxial growth and after epitaxial growth, in accordance with some embodiments of the present disclosure.

FIG. 3 is a graph of in-situ wafer curvature of a semiconductor structure during epitaxial growth and after epitaxial growth, in accordance with some embodiments of the present disclosure. In FIG. 3, the values on the horizontal axis represent the epitaxial growing time (second), and the values on the vertical axis represent the in-situ wafer curvature.

TABLE 2

|  | x1 | y1 | x2 | y2 | x3 | y3 |
|---|---|---|---|---|---|---|
| Experiment 1 | 0.6~0.7 | 0.1~0.3 | 0.8~0.9 | 0.15~0.4 | 0.9~1 | 0.2~0.5 |
| Experiment2 | 0.8~1 | 0.1~0.3 | 0.8~1 | 0.15~0.4 | 0.95~1 | 0.2~0.5 |
| Experiment3 | 0.8~0.9 | 0.1~0.15 | 0.9~1 | 0.2~0.25 | 0.95~1 | 0.3~0.35 |
| Experiment4 | 0.8~0.9 | 0.15~0.25 | 0.9~1 | 0.15~0.25 | 0.95~1 | 0.35~0.4 |

In some embodiments, M1 is less than M2, and M2 is less than M3. That is, the repetitively stacked times M1 of the first units of the first superlattice part SL1 is less than the repetitively stacked times M2 of the second units of the second superlattice part SL2, and the repetitively stacked times M2 of the second units of the second superlattice part SL2 is less than the repetitively stacked times M3 of the third units of the third superlattice part SL3.

Also, in some embodiments, after epitaxial growth of the above sub-layers to form the buffer layer 106 as shown in FIG. 2, the overall thickness of the first superlattice part SL1 is less than the overall thickness of the second superlattice part SL2, and the overall thickness of the second superlattice part SL2 is less than the overall thickness of the third superlattice part SL3.

According to the semiconductor structure in some embodiments, the substrate 102 includes a base 102$_C$ (made of a ceramic material) and an insulating layer 102$_M$ encapsulating the base 102$_C$. As shown in FIG. 3, after the first superlattice part SL1 and the second superlattice part SL2 having the sub-layers as described above are formed on the substrate 102 by epitaxial growth, the sub-layers of the superlattice parts generate tensile stress on the substrate before a cooling step is performed. Thus, the curve of the in-situ wafer curvature descends, and the values of the wafer curvature are negative. That is, the wafer has a concave cross-section. Next, a cooling step is performed, the sub-layers of the superlattice parts generate compressive stress. The compressive stress and the tensile stress that is generated before cooling are mutually compensated, so that the curve of the in-situ wafer curvature rises upward. The value of wafer curvature is increased. When the value of the wafer curvature is positive, the wafer has a convex cross-section.

Thus, according to the aforementioned superlattice structures, such as the sub-layers of the first superlattice part SL1 and the second superlattice part SL2 of the semiconductor structure in some embodiments, the tensile stress of the sub-layers generated by epitaxial growth can be compensated by the compressive stress generated by cooling process, so that the concave cross-section of the wafer gradually becomes flat. Therefore, the surfaces of the substrate 102 and the epitaxial stack 111 will be flatter, and the degree of wafer bow is greatly reduced, thereby improving the electrical performance of each of the semiconductor devices (such as transistors) fabricated on the wafer.

Figure 4:
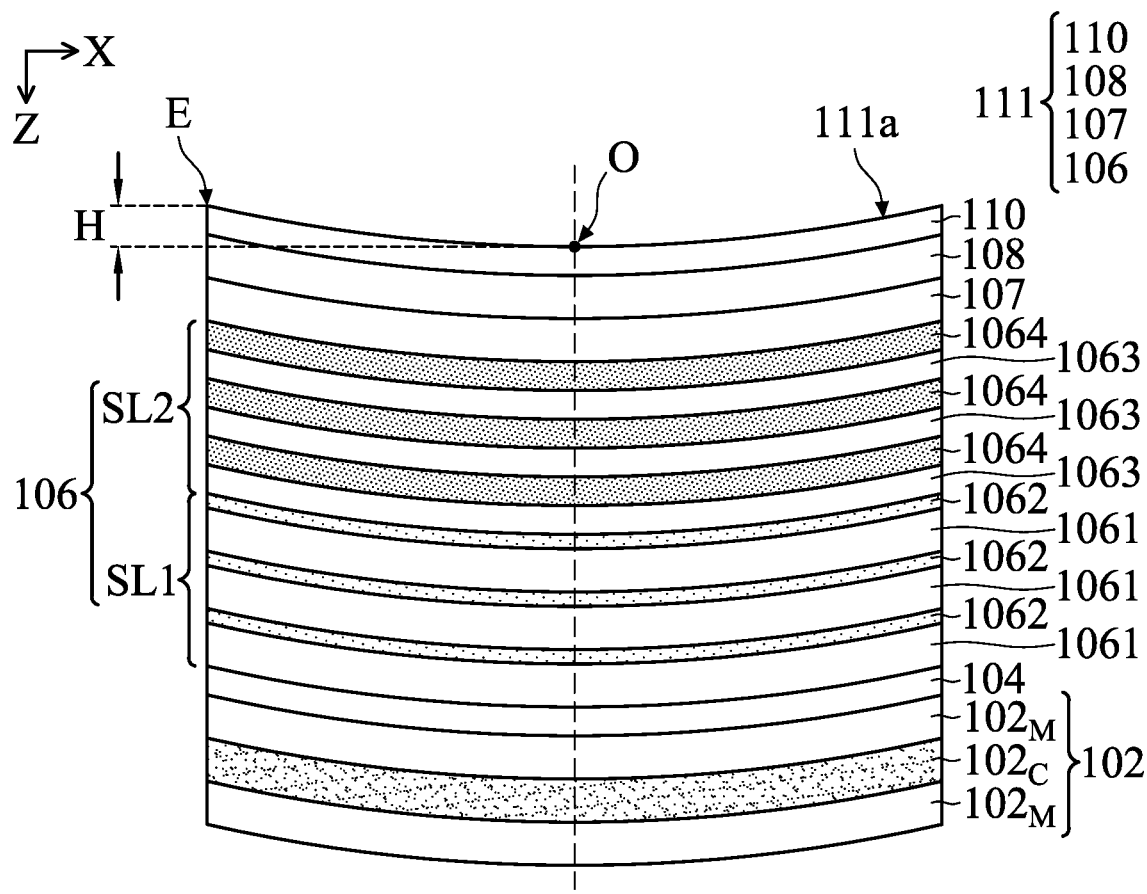
FIG. 4 is a cross-sectional view of a warped semiconductor structure in accordance with some embodiments of the present disclosure.

FIG. 4 is a cross-sectional view of a warped semiconductor structure in accordance with some embodiments of the present disclosure. This figure simply illustrates a semiconductor structure including the above-described substrate 102, the seed layer 104 and the epitaxial stack 111. According to some embodiments, a wafer bow of the semiconductor structure can be defined as a height difference between the height of the center of the wafer surface in the Z direction (or vertical direction) and the height of the edge of the wafer surface in the Z direction. In some embodiments, a reference surface of the epitaxial stack 111, such as the upper surface of the barrier layer 110, can be referred as the wafer surface in the above definition. The value of wafer bow can be obtained by measuring the height difference between the center and the edge of the wafer surface. In some other embodiments, a reference surface of the epitaxial stack 111, such as the bottom surface of the substrate 102, can be referred as the wafer surface in the above definition for measuring the height difference between the center and the edge of the bottom surface of the substrate 102.

As shown in FIG. 4, the top surface 111a of the epitaxial stack 111, such as the upper surface of the barrier layer 110, is selected as a reference surface for measuring the wafer bow. In some embodiments, a vertical height difference (in the Z direction) between the center O of the top surface 111a of the epitaxial stack 111 and the edge E of the top surface 111a of the epitaxial stack 111 is in a range of −10 μm to +10 μm after the cooling step is performed.

Compared to the existing superlattice structures, the superlattice parts provided by the semiconductor structure in accordance with some embodiments of the present disclosure can produce a wafer with a small degree of warpage. When the degree of wafer warpage is controlled, the electrical uniformity between the semiconductor devices fabricated on the wafer can be significantly improved, thereby increasing the production yield of the products. Several simulation experiments are performed, and the values of initial bow and final bow are measured for investigating the degree of wafer warpage. Superlattice structures and results in some simulation experiments are provided below as examples.

Figure 5A:
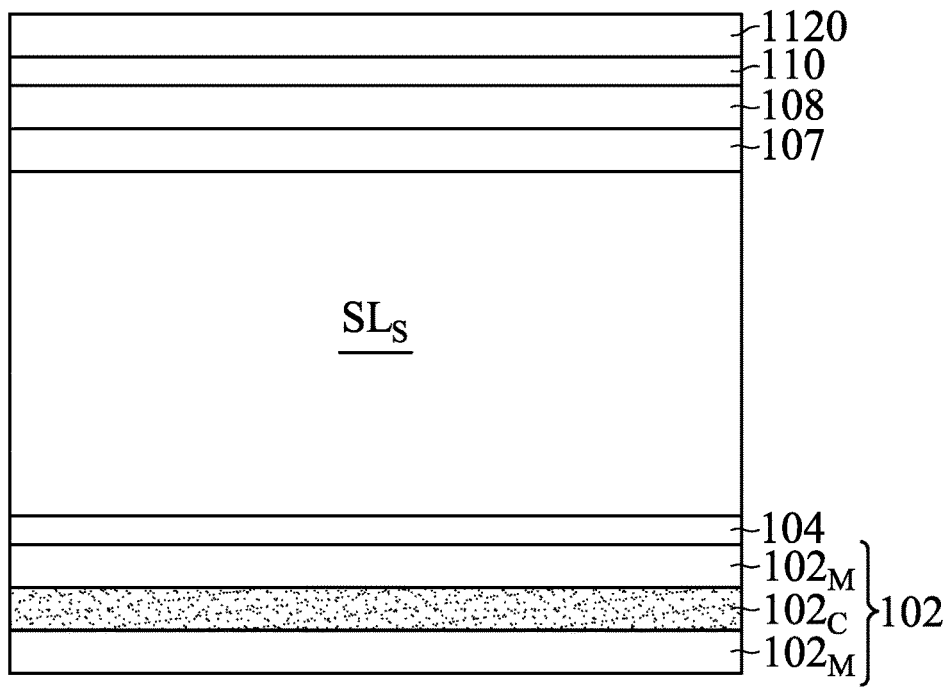
FIGS. 5A, 5B and 5C respectively illustrate cross-sectional views of the semiconductor structures in Comparative Example 1, Comparative Example 2 and Embodiment 1 of the simulation experiments.
Figure 5B:
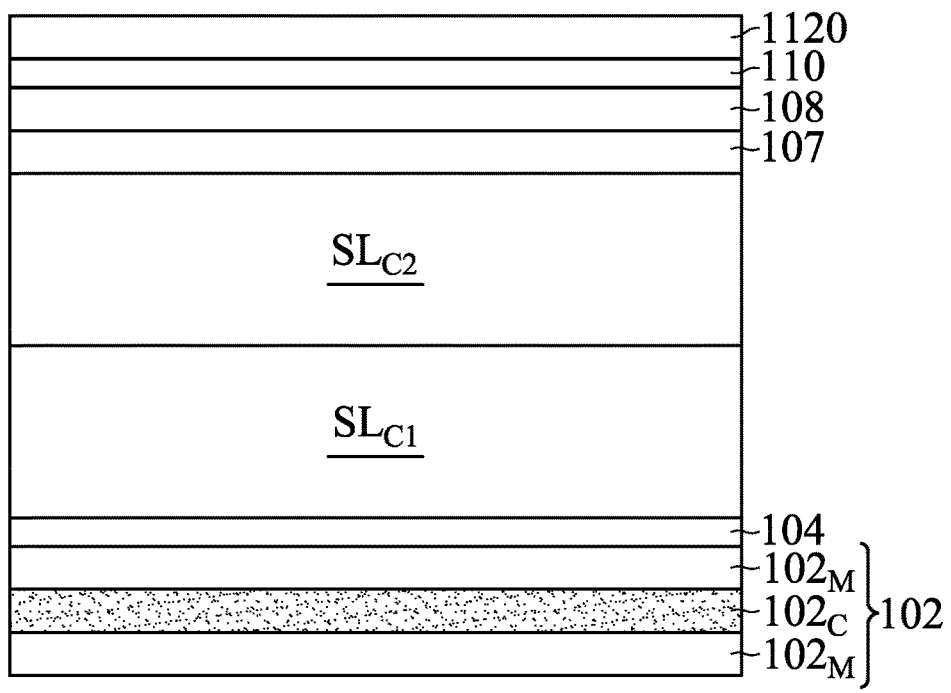
Figure 5C:
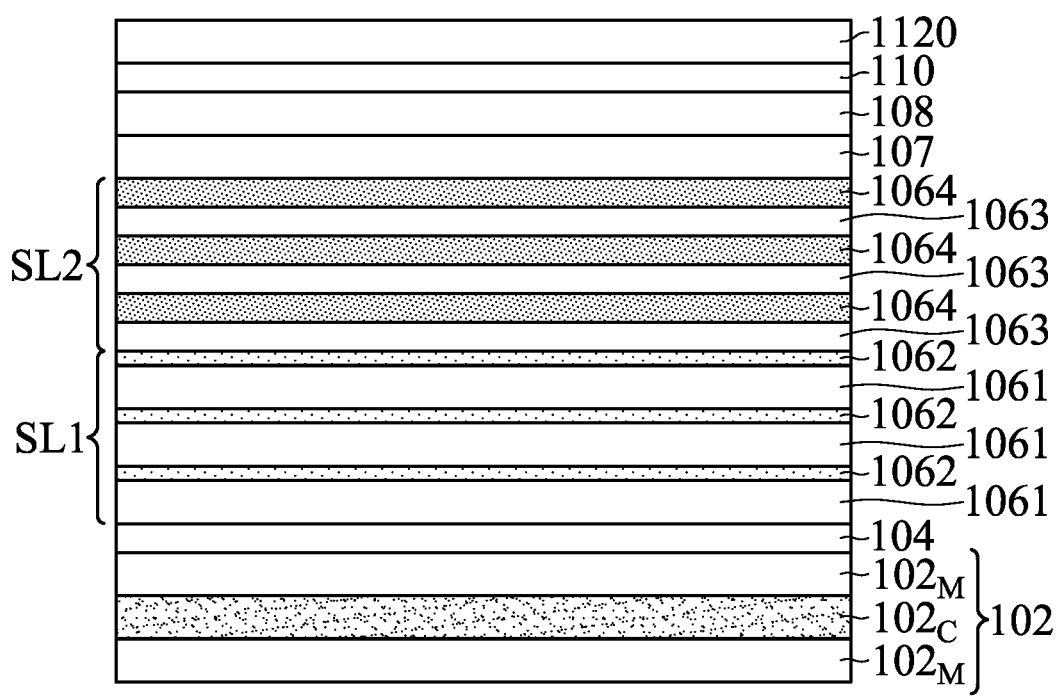

FIGS. 5A, 5B and 5C respectively illustrate cross-sectional views of the semiconductor structures in Comparative Example 1, Comparative Example 2 and Embodiment 1 of the simulation experiments. The semiconductor structure in Comparative Example 1 (FIG. 5A) is a semiconductor structure including a single superlattice part $SL_S$. The semiconductor structure in Comparative Example 2 (FIG. 5B) is a semiconductor structure including two superlattice parts $SL_{C1}$ and $SL_{C1}$. The semiconductor structure in Embodiment 1 (FIG. 5C) is a semiconductor structure shown in FIG. 1C in accordance with one embodiment of the present disclosure.

In the simulation experiments, the difference between those three semiconductor structures is the configurations of superlattice structures. The features/components in FIG. 5A-5C similar or identical to the features/components in FIG. 1E and FIG. 2 are designated with similar or the same reference numbers, and the description of those similar or identical features/components are not repeated herein. For example, the carbon-containing gallium nitride layer 107 (about 1 μm of a C—GaN layer), the channel layer 108 (about 400 nm of a GaN layer), the barrier layer 110 (about 12.5 nm of an Al0.25GaN layer) and the p-type doped GaN layer 1120 (about 80 nm of a p-type GaN, which is patterned later to form the doped III-V group compound semiconductor 112P as shown in FIG. 1D) are subsequently formed on the superlattice layer. Also, the positions and materials of those material layers may be similar to, or the same as the embodiments described above, and those details are not repeated herein.

The superlattice parts in three different semiconductor structures (including Comparative Example 1, Comparative Example 2 and Embodiment 1) are represented as:

The superlattice part $SL_S$ in Comparative Example 1:

180×[8 nm AlN/10 nm $Al_{0.1}Ga_{0.9}N$],

In Comparative Example 1 (as shown in FIG. 5A), the superlattice part $SL_S$ includes several units repetitively stacked 180 times above the substrate 102, wherein each of the units includes an $Al_{0.1}Ga_{0.9}N$ layer with a thickness of 10 nm, and an aluminum nitride (AlN) layer with a thickness of 8 nm on the $Al_{0.1}Ga_{0.9}N$ layer.

The superlattice part SL1 in Comparative Example 2 (FIG. 5B):

25×[5 nm AlN/28 nm $Al_{0.2}Ga_{0.8}N$]; and the superlattice part SL2 in Comparative Example 2 (FIG. 5B):

168×[8 nm AlN/10 nm $Al_{0.1}Ga_{0.9}N$], wherein the superlattice part SL2 is formed on the superlattice part SL1.

Figure 6:
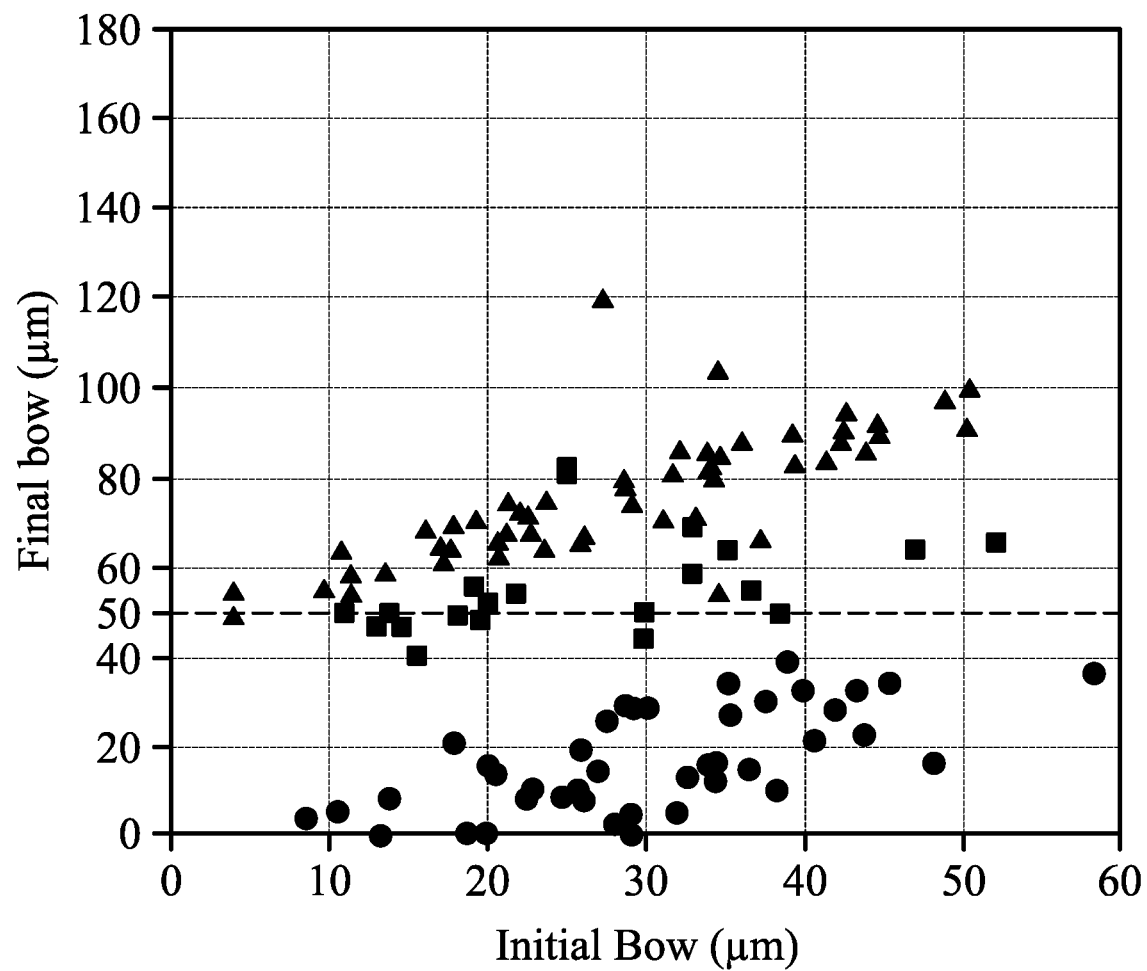
FIG. 6 shows results of wafer warpage of the semiconductor structures of Comparative Example 1, Comparative Example 2 and Embodiment 1 in the simulation experiments.

The first superlattice part SL1 (FIG. 5C) in Experiment 1:

25×[12 nm $Al_{0.74}Ga_{0.26}N$/26 nm $Al_{0.17}Ga_{0.83}N$]; and the second superlattice part SL2 (FIG. 5C) in Experiment 1:

80×[20 nm $Al_{1.00}Ga_{0.0}N$/18 nm $Al_{0.23}Ga_{0.77}N$],

FIG. 6 shows results of wafer warpage of the semiconductor structures of Comparative Example 1, Comparative Example 2 and Embodiment 1 in the simulation experiments. In FIG. 6, the values on the horizontal axis represent the values of initial bow of the wafer, and the values on the vertical axis represent the values of the final bow of the wafer. Also, ▲ is a symbol representing the wafer warpage results of Comparative Example 1, ■ is a symbol representing wafer warpage results of Comparative Example 2, and ● is a symbol representing wafer warpage results of Embodiment 1.

According to the simulation and experimental results, the semiconductor structure in Comparative Example 1 uses a single superlattice part $SL_S$, and the values of the final bow that are measured between the values of the initial bow of 10 μm to 60 μm are greater than 50 μm. In addition, the results of Comparative Example 1 have indicated that the values of the final bow increases with the increase of the values of the initial bow. Also, the semiconductor structure in Comparative Example 2 uses two superlattice parts $SL_{C2}$ and $SL_{C1}$, and the values of the final bow that are measured between the values of the initial bow of 10 μm to 60 μm are in a range of about 50 μm to about 80 μm. However, the semiconductor structure in Embodiment 1 has a smaller degree of wafer warpage. According to the results of the semiconductor structure in Embodiment 1, the values of the final bow that are measured between the values of the initial bow of 10 μm to 60 μm are no more than about 40 μm. In some experimental results in Embodiment 1, the values of the final bow are no more than about 20 μm; and in some other experimental results, the values of the final bow are no more than about 10 μm. Thus, the superlattice structures provided by the embodiments of the present disclosure do significantly decrease the degree of wafer warpage in the final state. In general, when the value of the final bow is about 50 μm or more than 50 μm, a wafer would be broken or cracked. Therefore, if 50 μm of the final bow is regarded as a critical value of a wafer bow yield, the superlattice structures provided by the embodiments of the present disclosure can improve the wafer bow yield to 100%.

According to the aforementioned descriptions, the semiconductor structure in some embodiments including the superlattice structures (such as the first superlattice part SL1 and the second superlattice part SL2) can greatly reduce the degree of wafer bow. For example, the vertical height difference between the center and the edge of the top surface of the wafer is in a range of −10 μm to +10 μm. Also, the superlattice structures of the embodiments also prevent the wafer from cracking. Therefore, the electrical performance of each of the semiconductor devices (such as transistors) fabricated on the wafer using the semiconductor structure of the embodiments can be improved. Also, the electrical uniformity between the semiconductor devices fabricated on the wafer can be significantly improved, thereby increasing the production yield of the semiconductor devices. In addition, the method of forming the semiconductor devices in accordance with some embodiments of the present disclosure is compatible with the existing manufacturing method, so that the wafer warpage can be significantly improved without increasing the production cost.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
   a substrate;
   a seed layer on the substrate; and
   an epitaxial stack on the seed layer, the epitaxial stack comprising:
   a first superlattice part on the seed layer, wherein the first superlattice part comprises first units repetitively stacked M1 times on the seed layer, and each of the first units comprises:
   a first sub-layer including an $Al_{y1}Ga_{1-y1}N$ layer with a thickness of b1 nanometers (nm); and
   a second sub-layer on the first sub-layer, the second sub-layer including an $Al_{x1}Ga_{1-x1}N$ layer with a thickness of a1 nanometers (nm), wherein the first sub-layer is closer to the substrate than the second sub-layer, and y1 is less than x1; and
   a second superlattice part on the first superlattice part, wherein the second superlattice part comprises second units repetitively stacked M2 times on the first superlattice part, and each of the second units comprises:
   a third sub-layer including an $Al_{y2}Ga_{1-y2}N$ layer with a thickness of b2 nanometers (nm); and
   a fourth sub-layer on the third sub-layer, the fourth sub-layer including an $Al_{x2}Ga_{1-x2}N$ layer with a thickness of a2 nanometers (nm), wherein the third sub-layer is closer to the substrate than the fourth sub-layer, and y2 is less than x2,
   wherein M1 and M2 are positive integers, x1, y1 and y2 are greater than 0 and less than 1, x2 is greater than 0 and equal to or less than 1; and
   wherein x1 is less than x2, or x1 is equal to x2 and y1 is less than y2.

2. The semiconductor structure as claimed in claim 1, wherein a vertical height difference between a center of a top surface and an edge of the top surface of the semiconductor structure is in a range of −10 μm to +10 μm.

3. The semiconductor structure as claimed in claim 1, wherein y1 is less than y2.

4. The semiconductor structure as claimed in claim 3, wherein x1 is greater than y1, and x2 is greater than y2.

5. The semiconductor structure as claimed in claim 1, wherein a1 is less than a2.

6. The semiconductor structure as claimed in claim 5, wherein b1 is greater than b2.

7. The semiconductor structure as claimed in claim 1, wherein y2 is greater than y1, and b2 is greater than b1.

8. The semiconductor structure as claimed in claim 1, wherein a1 is equal to or greater than a2.

9. The semiconductor structure as claimed in claim 1, wherein M1 is less than M2.

10. The semiconductor structure as claimed in claim 1, wherein an overall thickness of the first superlattice part is less than an overall thickness of the second superlattice part.

11. The semiconductor structure as claimed in claim 1, wherein x1 is in a range of 0.6 to 1, and x2 is in a range of 0.8 to 1.

12. The semiconductor structure as claimed in claim 1, wherein y1 is in a range of 0.1 to 0.3, and y2 is in a range of 0.15 to 0.4.

13. The semiconductor structure as claimed in claim 1, wherein the substrate comprises a base and at least one insulating material layer on the base.

14. The semiconductor structure as claimed in claim 13, wherein the substrate comprises a ceramic material, the insulating material layer encapsulates the base, and the insulating material layer comprises an oxide, a nitride, an oxynitride, or a combination thereof.

15. The semiconductor structure as claimed in claim 1, wherein the first superlattice part comprises a first dopant having a first doping concentration, and the second superlattice part comprises a second dopant having a second doping concentration, wherein the second doping concentration is greater than the first doping concentration.

16. The semiconductor structure as claimed in claim 15, wherein the first dopant and the second dopant are independently selected from carbon or iron.

17. The semiconductor structure as claimed in claim 1, wherein the epitaxial stack further comprises:
a third superlattice part on the second superlattice part, wherein the third superlattice part comprises third units repetitively stacked M3 times on the second superlattice part, and each of the third units comprises:
a fifth sub-layer including an $Al_{y3}Ga_{1-y3}N$ layer with a thickness of b3 nanometers (nm); and
a sixth sub-layer on the fifth sub-layer, the sixth sub-layer including an $Al_{x3}Ga_{1-x3}N$ layer with a thickness of a3 nanometers (nm), wherein y3 is less than x3,
wherein M3 is a positive integer, y3 is greater than 0 and less than 1, x3 is greater than 0 and equal to or less than 1; and
wherein x2 is less than x3, or x2 is equal to x3 and y2 is less than y3.

18. The semiconductor structure as claimed in claim 17, wherein when x2 is less than x3, y2 is less than y3.

19. The semiconductor structure as claimed in claim 17, wherein a2 is less than a3.

20. The semiconductor structure as claimed in claim 19, wherein b2 is greater than b3.

21. The semiconductor structure as claimed in claim 17, wherein y3 is greater than y2, y2 is greater than y1, b3 is greater than b2, and b2 is greater than b1.

22. The semiconductor structure as claimed in claim 21, wherein a1 is equal to or greater than a2, and a2 is equal to or greater than a3.

23. The semiconductor structure as claimed in claim 17, wherein an overall thickness of the first superlattice part is less than an overall thickness of the second superlattice part, and the overall thickness of the second superlattice part is less than an overall thickness of the third superlattice part.

24. The semiconductor structure as claimed in claim 17, wherein M2 is less than M3.

25. The semiconductor structure as claimed in claim 17, wherein x3 is in a range of 0.9 to 1, and y3 is in a range of 0.2 to 0.5.

26. The semiconductor structure as claimed in claim 17, wherein the first superlattice part comprises a first dopant having a first doping concentration, the second superlattice part comprises a second dopant having a second doping concentration, and the third superlattice part comprises a third dopant having a third doping concentration, wherein the second doping concentration is greater than the first doping concentration, and the third doping concentration is greater than the second doping concentration.

27. The semiconductor structure as claimed in claim 1, wherein the epitaxial stack further comprises:
a channel layer above the second superlattice part; and
a barrier layer on the channel layer.

28. The semiconductor structure as claimed in claim 27, wherein the epitaxial stack further comprises:
a carbon-containing gallium nitride (C—GaN) layer on the second superlattice part, wherein the channel layer is on the carbon-containing GaN layer; and
a p-type doped GaN layer on the barrier layer.

29. A high-electron mobility transistor (HEMT) device, comprising:
the semiconductor structure of claim 1;
a first insulating layer on the epitaxial stack;
a gate electrode on the first insulating layer;
a second insulating layer on the first insulating layer, wherein the second insulating layer conformally covers the gate electrode;
a source electrode and a drain electrode at two opposite sides of the gate electrode, wherein the source electrode and the drain electrode penetrate the second insulating layer and the first insulating layer; and
a third insulating layer on the second insulating layer, and the third insulating layer conformally covers the source electrode and the drain electrode.

* * * * *